(12) United States Patent
Masleid (10) Patent No.: US 8,341,585 B2
(45) Date of Patent: Dec. 25, 2012

(54) SKEWED PLACEMENT GRID FOR VERY LARGE SCALE INTEGRATED CIRCUITS

(75) Inventor: Robert P. Masleid, Monte Sereno, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/022,913

(22) Filed: Feb. 8, 2011

(65) Prior Publication Data

US 2012/0200347 A1 Aug. 9, 2012

(51) Int. Cl.
*G06F 17/50* (2006.01)

(52) U.S. Cl. ........ 716/122; 716/124; 716/126; 716/128; 716/130; 716/134; 326/39; 326/40; 326/41

(58) Field of Classification Search .......... 716/118–135; 326/39, 40, 41
See application file for complete search history.

(56) References Cited

U.S. PATENT DOCUMENTS

| | | | | |
|---|---|---|---|---|
| 3,726,993 | A * | 4/1973 | Lavallee | 358/426.11 |
| 6,370,673 | B1 * | 4/2002 | Hill | 716/123 |
| 7,739,644 | B1 | 6/2010 | Chong | |
| 7,802,219 | B2 | 9/2010 | Tomar | |
| 2006/0117274 | A1 * | 6/2006 | Tseng et al. | 716/1 |
| 2006/0225020 | A1 * | 10/2006 | Chandrakasan et al. | 716/17 |
| 2008/0077899 | A1 * | 3/2008 | Dutt et al. | 716/10 |
| 2010/0211719 | A1 * | 8/2010 | Satpathy et al. | 710/317 |
| 2010/0283505 | A1 * | 11/2010 | Koch et al. | 326/41 |

* cited by examiner

*Primary Examiner* — Nha Nguyen
(74) *Attorney, Agent, or Firm* — Meyerton Hood Kivlin Kowert & Goetzel; Erik A. Heter (57) ABSTRACT

A skewed placement grid for an integrated circuit (IC) is disclosed. In one embodiment, an IC includes a placement grid which includes a plurality of cells. Each of the plurality of cells includes one of a corresponding plurality of circuits. A center point of each of the cells is located at a unique coordinate along a first axis and a second axis with respect to each of the other ones of the plurality of cells. The IC further includes a first plurality of signal interconnections, wherein each of the plurality of signal interconnections is coupled to a corresponding one of the first plurality of circuits.

20 Claims, 8 Drawing Sheets

SKEWED PLACEMENT GRID FOR VERY LARGE SCALE INTEGRATED CIRCUITS

BACKGROUND

1. Field of the Invention

This invention relates to integrated circuits (ICs), and more particularly, to the placement of circuitry and interconnections on integrated circuits.

2. Description of the Related Art

As the feature sizes of devices implemented on ICs have shrunk, the number of devices has increased. Operating speeds of ICs has similarly increased. The increase in the number of devices on a single IC has resulted in a corresponding increase in the number of interconnections. Furthermore, since operating speeds of ICs have increased, the apparent distance between some circuits has increased, in some cases such that signal travel times cross clock boundaries. For many long distance signal routes, repeater circuits are required, regardless of whether a clock boundary is crossed.

The large number of interconnections necessitated by the large number of devices on an IC can consume a significant amount of area. Furthermore, the number of interconnections can cause the paths of some to interfere with others. In order to overcome this, many of the interconnections include bends and transitions to other layers through vias in order to avoid other interconnections. While this may enable a large number of interconnections to be implemented on a single IC, it can cause some performance issues. For example, parasitic resistances may be larger for signal interconnections that include a number of bends and vias that are implemented to avoid collisions with other interconnections. The increased resistance may in turn result in longer signal propagation times, which can limit the operating frequency of the IC and/or necessitate additional state element circuits when the propagation time for particular interconnects crosses a clock boundary.

SUMMARY OF THE DISCLOSURE

A skewed placement grid for an integrated circuit (IC) is disclosed. In one embodiment, an IC includes a placement grid which includes a plurality of cells. Each of the plurality of cells includes one of a corresponding plurality of circuits. A center point of each of the cells is located at a unique coordinate along a first axis and a second axis with respect to each of the other ones of the plurality of cells. The IC further includes a first plurality of signal interconnections, wherein each of the plurality of signal interconnections is coupled to a corresponding one of the first plurality of circuits.

In one embodiment, an IC includes a plurality of buses including at lease one bus aligned along a first axis, and at least one bus aligned along a second axis. The IC further includes a plurality of rectangular cells arranged at an intersection of two or more of the plurality of buses. Each of the rectangular cells includes a corresponding one of a plurality of circuits coupled between two or more of the plurality of buses. Each of the plurality of rectangular cells is adjacent to two or more other ones of the plurality of rectangular cells, and is offset along both the first axis and the second axis with respect to each adjacent one of the plurality of rectangular cells.

One embodiment of a method for performing a layout of an IC includes assigning each of a plurality of circuits to corresponding ones of a plurality of cells. The method further includes arranging the plurality of cells in a placement grid such that a center point of each of the plurality of cells is located at a unique coordinate along a first axis and a second axis with respect to each of the other ones of the plurality of cells. Each of a plurality of signal lines is arranged to be coupled to a corresponding one of the plurality of circuits.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Figure 1:
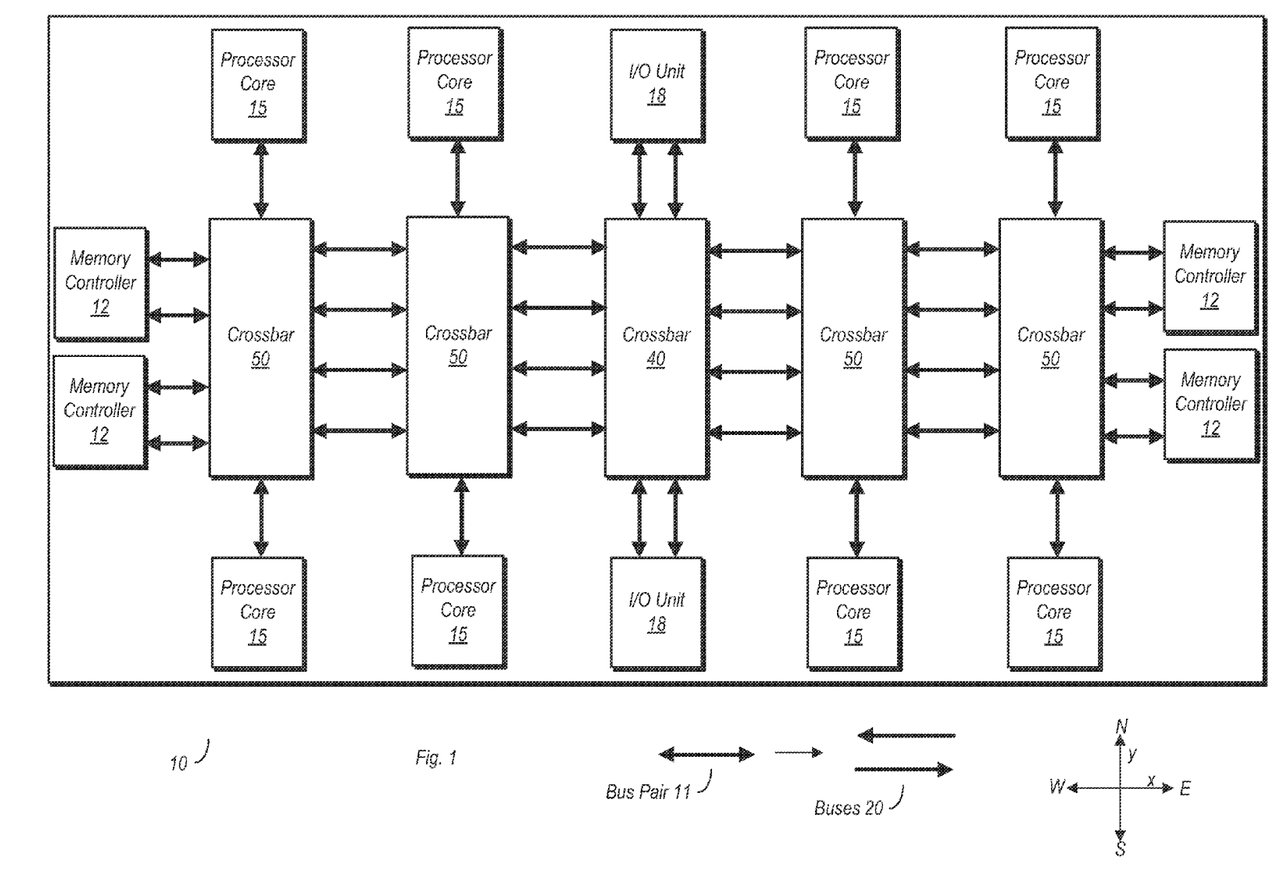
FIG. 1 is a block diagram of one embodiment of an integrated circuit (IC)

Integrated Circuit:

Turning now to FIG. 1, a block diagram of one embodiment of an IC is illustrated. In the embodiment shown, IC 10 includes four memory controllers 12, eight processor cores 15, and two input/output (I/O) units 18. Each of these various agents may be coupled to any one of the others of IC 10 through an on-die data network that includes crossbar unit 40, four instances of crossbar unit 50, and a number of unidirectional buses depicted here as bus pairs 11. Additional circuitry, such as repeater circuitry, may be located between the various units in FIG. 1. This circuitry, as well as the crossbar circuitry may be implemented in skewed placement grids, as will be discussed in further detail below.

Each bus pair 11, represented here by the bidirectional arrows, includes two physically separate unidirectional buses 20. Each bus 20 of a given bus pair 11 is arranged (through coupling of transmitters and receivers) to convey signals in one direction only. Furthermore, counterpart buses 20 of each bus pair 11 are arranged to convey signals in opposite directions. Each of buses 20 includes a plurality of signal interconnections (which may alternately be referred to as 'signal lines', 'wires', and so forth). In one embodiment, the long distance signal interconnection between circuits (e.g., between a crossbar 40/50 and another crossbar) may be implemented as straight lines aligned with a given axis.

In the embodiment shown, a given bus 20 of a bus pair 11 may convey signals along one of two different axes, the x-axis or y-axis, which are perpendicular with respect to each other.

Furthermore, a given bus 20 of a bus pair 11 in the embodiment shown may convey signals in one of four different directions, north, south, east, or west. Signals traveling east or west are conveyed along the x-axis in this embodiment. Signals traveling north or south are conveyed along the y-axis in this embodiment. It is noted that the terms of the preceding sentence are used here for the sake of simplifying the explanation the physical arrangement of buses 20 in the context of this embodiment of IC 10. Accordingly, the terms 'north,' 'south,' 'east,' and 'west' are only intended to convey information relative to a direction that signals travel on a bus 20 of IC 10, but are not intended to be construed in a geographic context. The same applies to the terms 'westbound', 'eastbound', 'northbound', and 'southbound' as used herein.

Each of the buses 20 may include a total of N signal lines, and may thus be N bits wide. In one exemplary embodiment, each bus may include 128 (N=128) signal lines each. The buses may convey data signals, control signals, address signals, error correction code (ECC) signals, and so forth. In one embodiment, each of buses 20 may be configured to convey M data signals, where M is an integer value that is less than or equal to N.

Crossbar unit 40 in the embodiment shown is a 12×12 crossbar unit. That is, crossbar unit 40 in the embodiment shown is coupled to receive inputs from 12 unique instances of buses 20, and is further coupled to provide outputs to 12 unique instances of buses 20. Crossbar units 50 are each 10×10 crossbar units, each coupled to 10 incoming buses and 10 outgoing buses. Each of crossbar units 40 and 50 is configured to couple one of its incoming buses to one of its outgoing buses in order to facilitate communications between a given pair of agents of IC 10. Although not explicitly shown here for the sake of simplicity, each of crossbar units 40 and 50 may be coupled to receive select signals to enable the coupling of a selected incoming bus to a selected outgoing bus.

Since each of the buses 20 is N bits wide in the illustrated embodiment, each of crossbar units 40 and 50 include N crossbar circuits, one for each bit. During the design of IC 10, each of the crossbar circuits may be assigned to a cell to be arranged in a skewed placement grid. The cells may be skewed in that each cell has a unique coordinates along two axes (e.g., unique x and y coordinates) with respect to each of the other cells in the grid. Similarly, repeaters and other circuitry may also be implemented using such grids.

Figure 2:
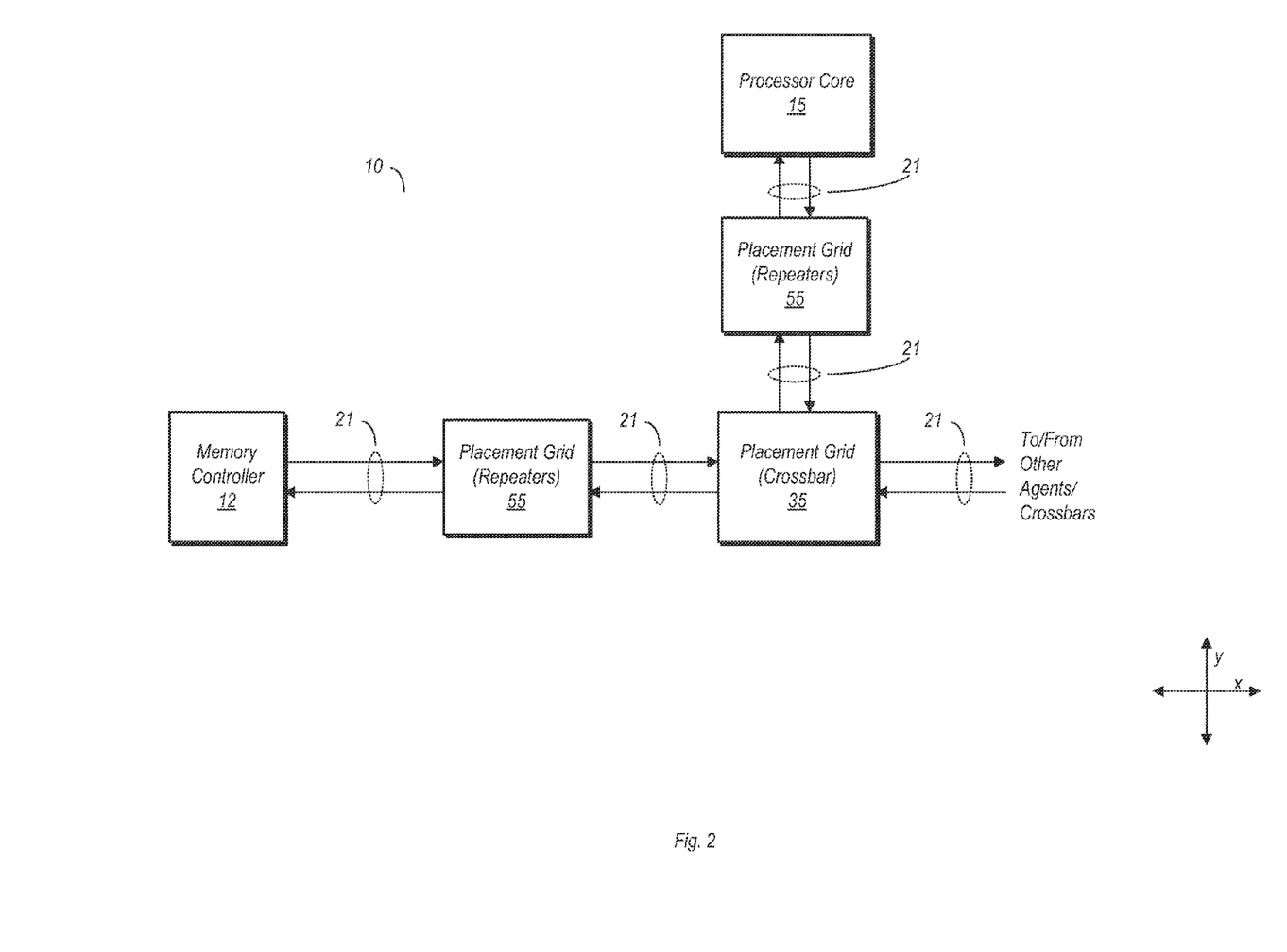
FIG. 2 is a block diagram illustrating additional details of one embodiment of an IC.

FIG. 2 is a block diagram illustrating additional details of one embodiment of an IC. More particularly, FIG. 2 illustrates additional details of IC 10. In the embodiment shown, memory controller 12 is coupled to placement grid 55 via two exemplary signal lines 21. These signal lines are representative signal lines of one of the larger buses shown in FIG. 1. As shown in the drawing, signal lines 21 are implemented as straight lines. While signal interconnections within certain circuits (e.g., within a crossbar circuit) may have bends, long distance signal lines, such as signal lines 21, may be implemented as straight lines. This may more efficiently utilize chip area. Furthermore, straight signal lines between two circuits may have less parasitic resistance than their counterparts implemented with bends, and thus may have faster signal propagation times.

Placement grid 55 in the embodiment shown implements a number of repeater circuits. The repeater circuits may provide an output signal based on a received input signal (e.g., at the same logical state). In some cases, the repeater circuits may include a state element. The repeaters of placement grid 55 may be arranged in identical cells in a manner such that the signal lines 21 may pass through with no bends, retaining their position relative to the y-axis while conveying signals along the x-axis.

A second placement grid 55 is coupled between processor core 15 and a crossbar unit formed by placement grid 35. The second placement grid 55 may also include repeaters, with signal lines 21 conveying signals along the y-axis. Signal lines 21 coupled between processor core 15, placement grid 55, and the crossbar implemented with placement grid 35 convey signals along the y-axis. Each of these signal lines 21 is a straight line, maintaining its position relative to the x-axis.

Placement grid 35 in the embodiment shown implements a plurality of crossbar circuits that form a crossbar unit (e.g. crossbar 40 or crossbar 50 of FIG. 1). The crossbar unit formed by the crossbar circuits of placement grid 35 may be used to provide a communications path between memory controller 12 and processor core 15, as well as to additional agents not explicitly shown here. Placement grid 35 may be arranged such that each of the signal lines 21 along both the x-axis and y-axis (which is perpendicular to the x-axis) are straight lines requiring no bends when coupled to its corresponding crossbar circuits. This may be accomplished by arranging the cells of placement grid 35 in a particular manner. Similarly, the cells of placement grids 55 may also be arranged in an analogous manner. The arrangements of various types of placement grids will now be discussed in conjunction with FIGS. 3-6.

Figure 3:
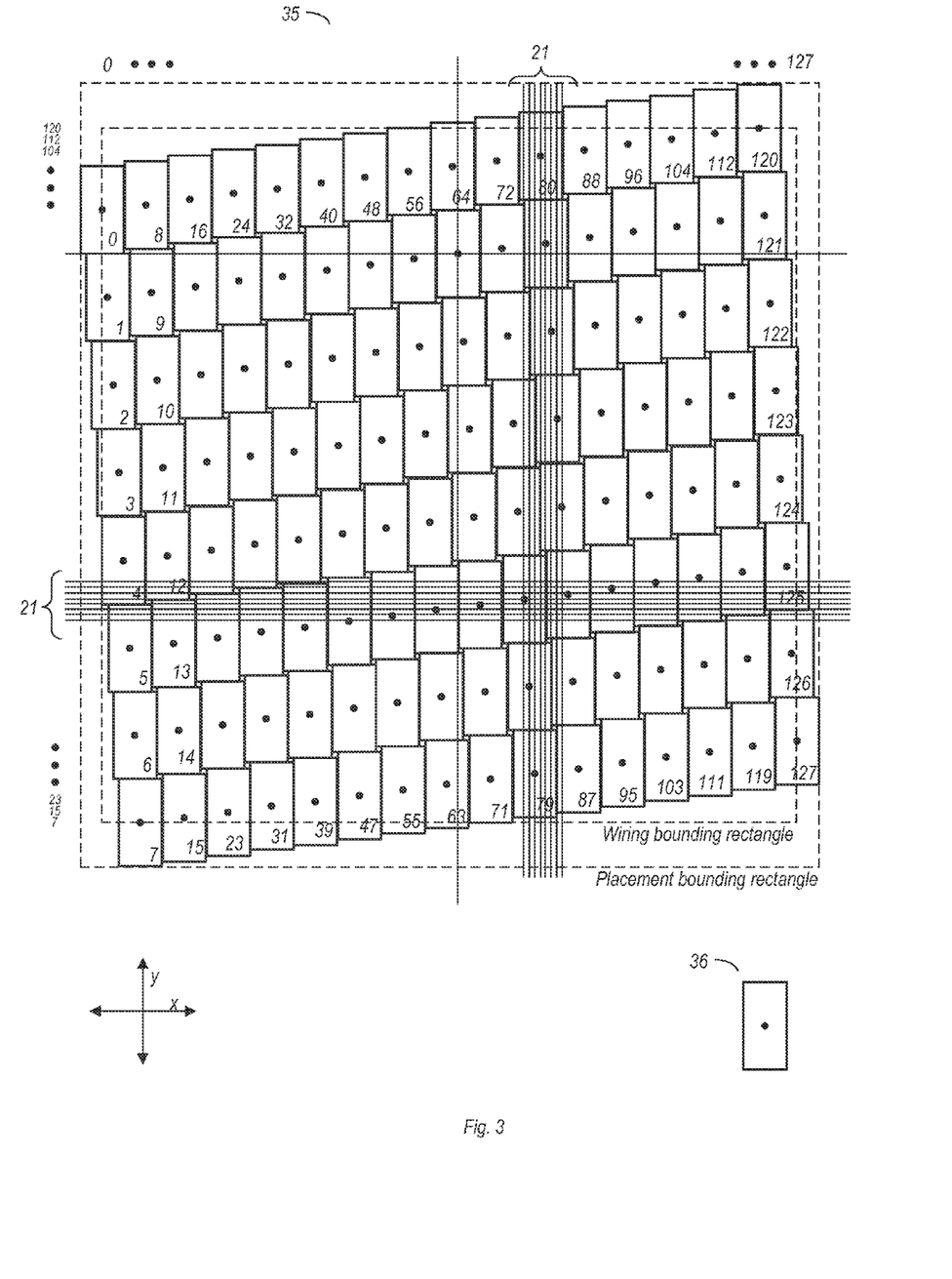
FIG. 3 is a diagram illustrating a first embodiment of a skewed placement grid implemented on an IC.

Skewed Placement Grid Embodiments:

FIG. 3 is a diagram illustrating an embodiment of a skewed placement grid implemented on IC 10. Placement grid 35 in the embodiment shown may be used to implement a crossbar unit including either or both types of crossbar units 40 and 50 of FIG. 1.

Placement grid 35 in the embodiment shown may be implemented using a number of rectangular cells 36, sixteen across and eight down. Each of rectangular cells 36 may include a corresponding instance of a circuit, in this case a crossbar circuit configured to couple corresponding signal lines (e.g., by bit position) of different buses to one another. Rectangular cells 36 may each be of the same size and may be arranged in a skewed placement grid. In order to form the skewed placement grid, each rectangular cell 36 is offset along both x and y axes with respect to each of its adjacent rectangular cells 36. Furthermore, each rectangular cell 36 is arranged in placement grid 35 such that its respective center point has a unique x-coordinate and a unique y-coordinate with respect to every other rectangular cell 36 of the grid. The rectangular cells 36 are further arranged such that none of them is overlapping with any other one. Accordingly, no rectangular cell 36 in placement grid 35 shares any common two-dimensional space with any other rectangular cell 36. Instead, each rectangular cell 36 in placement grid 35 occupies a unique two-dimensional space with respect to every other rectangular cell 36. However, two adjacent rectangular cells 36 may share a common border.

In the example shown, a black dot in the middle of each rectangular cell 36 encompasses that cell's center point. In some embodiments, stacked vias may be located within the area encompassed by the black dot. Such vias may provide connections from an upper metal layer of an IC to a lower metal layer of the IC where the circuitry (e.g., the crossbar circuit) is implemented. More particularly, the stacked vias may provide a connection between signal lines 21 and the circuitry implemented within the rectangular cells to which they are coupled.

The skewed arrangement of rectangular cells 36 in placement grid 35 enables each of signal lines 21, along both axes, to be implemented as straight lines. Using the black dot of each rectangular cell 36 as a reference point, each signal line 21 in the example shown intersects with only one black dot (and thus one stacked via) of one rectangular cell 36 of the entire grid. Thus, each signal line 21, both those oriented along the x-axis and those oriented along the y-axis, can be implemented as a straight line while intersecting a via of only a single rectangular cell 36. Therefore, each signal line 21 may be arranged to be coupled to only a single corresponding circuit within placement grid 35, while still being implemented as a straight line with no bends. It is noted that those signal lines 21 arranged to convey signals along the x-axis may be implemented on a different metal layer of the IC than those arranged to convey signals along the y-axis.

Using the arrangement shown in FIG. 3, vias in the same relative position within each of rectangular cells 36 may enable non-bending signal lines 21 to be coupled to a single corresponding circuit in the circuit structure implemented by placement grid 35 without interfering with the routing of other signal lines 21. Accordingly, arranging the long distance signal routes may be significantly simplified by the structure represented by placement grid 35. Furthermore, placing vias at the same relative positions within each of rectangular cells 36 may allow multiple signal lines 21 along each axis to be coupled to circuitry within corresponding cells. For example, a crossbar circuit of a 12×12 crossbar unit may include signal interconnections for twelve different bi-directional buses. Thus, in some embodiments, rectangular cells 36 may include circuitry connected to signal lines 21 for each bus coupled to the crossbar unit. Each of the signal lines 21 coupled to circuitry of a particular rectangular cell 36 may correspond to a particular bit position on the bus (e.g., bit 0).

In the embodiment of placement grid 35 illustrated in FIG. 3, bit numbering among rectangular cells 36, descending from the top of the page toward the bottom, are in sequential order (e.g., bit 0, bit 1, bit 2, and so on). That is, bit positions corresponding to adjacent ones of the plurality of rectangular cells arranged along the vertical axis are sequentially numbered descending from the top of the page to the bottom. Moving from left to right at the top on the page, the bit numbers increase in multi-bit increments (e.g., bit 0, bit 8, bit 16, and so on). This arrangement may afford conventional bus ordering (e.g., 0-127) for vertical buses (along the y-axis in this example), which connect to conventional data path or static random access memory (SRAM) structures that also use conventional ordering. Horizontal (along the x-axis in this example) may be scrambled (which may provide certain electrical benefits). For example, a horizontal signal line coupled to the rectangular cell 36 corresponding to bit 0 may be physically adjacent to the rectangular cell coupled to bit 8 (above) and bit 121 (below). Such horizontal connections may be less common in some ICs, and may thus tolerate the scrambling as shown here. Thus, the arrangement shown here may enable a horizontal bus having a scrambled signal line arrangement to be coupled to a vertical bus having a signal line arrangement with conventional ordering.

Figure 4:
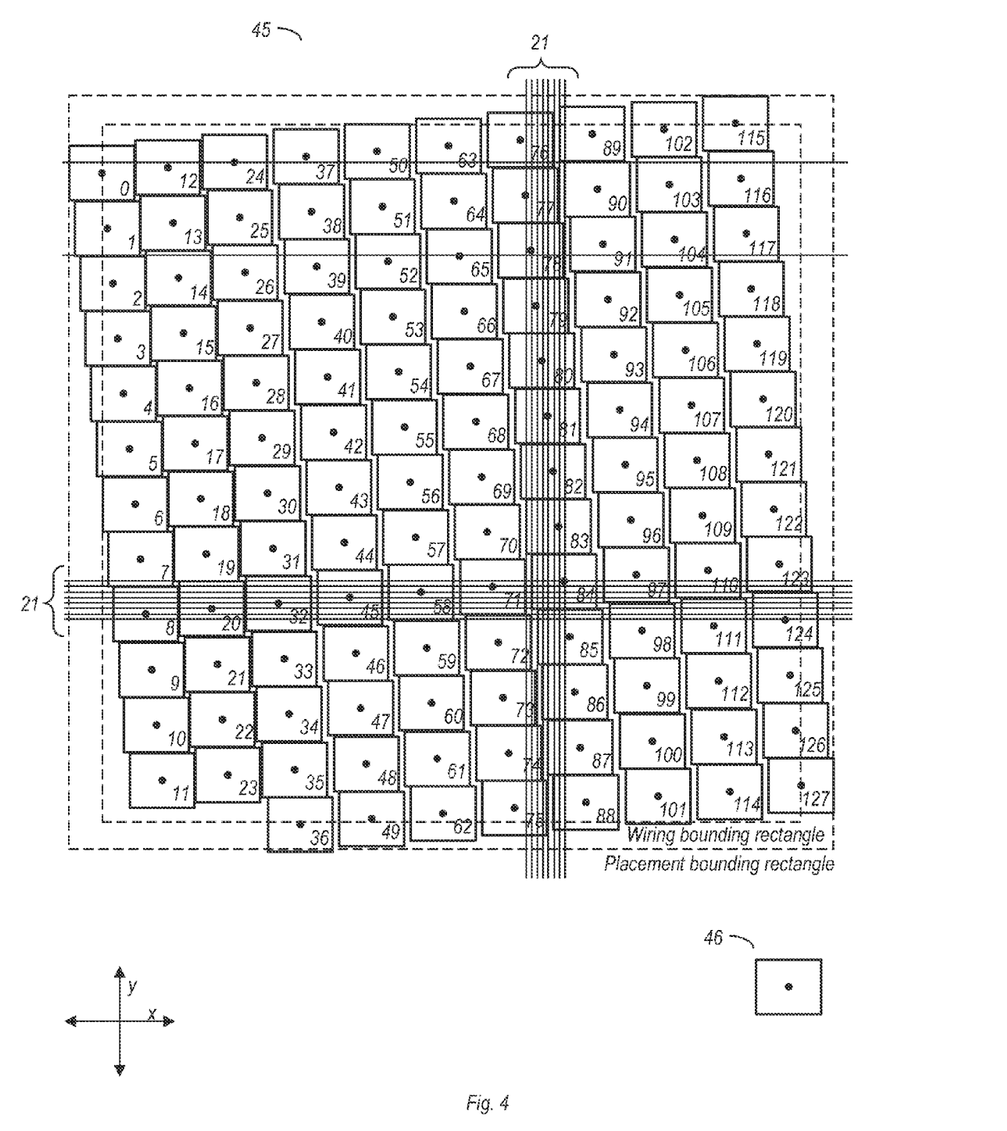
FIG. 4 is a diagram illustrating a second embodiment of a skewed placement grid implemented on an IC.

FIG. 4 is a diagram illustrating another embodiment of a skewed placement grid implemented on an IC. Placement grid 45 may be arranged having ten rectangular cells 46 across and thirteen rectangular cells 46 down. In this particular example, each rectangular cell 46 of placement grid 45 is a square rectangle. The rectangular cells 46 are arranged in a similar manner as the embodiment discussed above, with bit numbering in sequential order moving down the page and in incremental order moving across the page. Each signal line 21 along the x-axis in the embodiment shown intersects with only one stacked via (represented by a black dot in each cell). Similarly, each signal line 21 along the y-axis also intersects with only one stacked via. Accordingly, each signal line 21 along the x-axis is coupled to a circuit that is unique with respect to the other signal lines 21 arranged along the x-axis. This also holds true for each of the signal lines 21 arranged along the y-axis. Placement grid 45 may be suitable for various applications, including crossbar units as discussed above.

It is noted in the various embodiments shown, including that of FIG. 4, that wire bounding and placement bounding rectangles are shown. The wire bounding rectangle in these embodiments defines the area within their respective placement grids that signal lines 21 may be coupled to vias and thus the circuitry within a corresponding rectangular cell. The placement bounding rectangle in the illustrated embodiments defines an area within which rectangular cells may be placed. It is noted that these bounding rectangles are exemplary and not intended to be limiting for all embodiments. For example, while the wire bounding rectangle passes through a number of the black dots representing stacked vias in the illustrated embodiments, other embodiments may include wire bounding rectangles that pass through other portions of the outermost rectangular cells. Unlike the embodiment illustrated in FIG. 3, the embodiment shown in FIG. 4 does not use integer submultiples of the total number of cells in the vertical and horizontal arrangement thereof.

Figure 5:
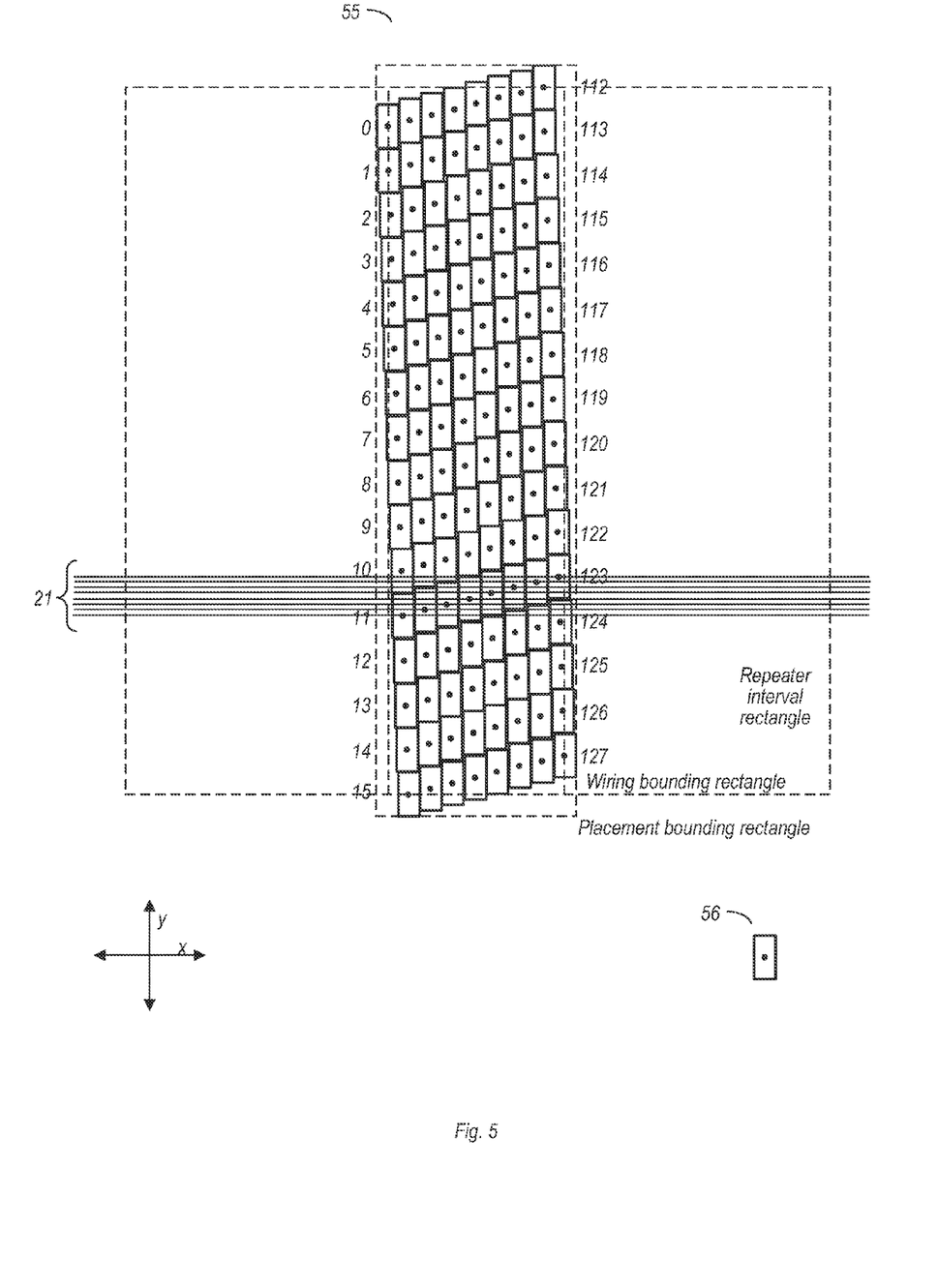
FIG. 5 is a diagram illustrating a third embodiment of a skewed placement grid implemented on an IC.

FIG. 5 is yet another embodiment of a placement grid. In the embodiment shown, placement grid 55 is arranged in skewed rows of eight rectangular cells 56 across and sixteen rectangular cells 56 down. A representative plurality of signal lines 21 is shown as horizontally (e.g., along the x-axis) intersecting the stacked vias of corresponding rectangular cells 56. Although not explicitly shown in this example, vertical (e.g., along the y-axis and perpendicular to the x-axis) signal lines may also intersect with the stacked vias of rectangular cells in a manner similar to that of the embodiments shown in FIGS. 3 and 4. As with those embodiments, the center point of each rectangular cell 56 has a unique x and y coordinate with respect to all other rectangular cells 56. Furthermore, the rectangular cells 56 are arranged such that none of them are overlapping, i.e. each rectangular cell 56 occupies a unique two-dimensional space with respect to every other rectangular cell 56. Placement grid 55 may be suitable for implementing repeaters on corresponding bus interconnections, and may in some cases also be suitable for implementing a crossbar unit.

Figure 6:
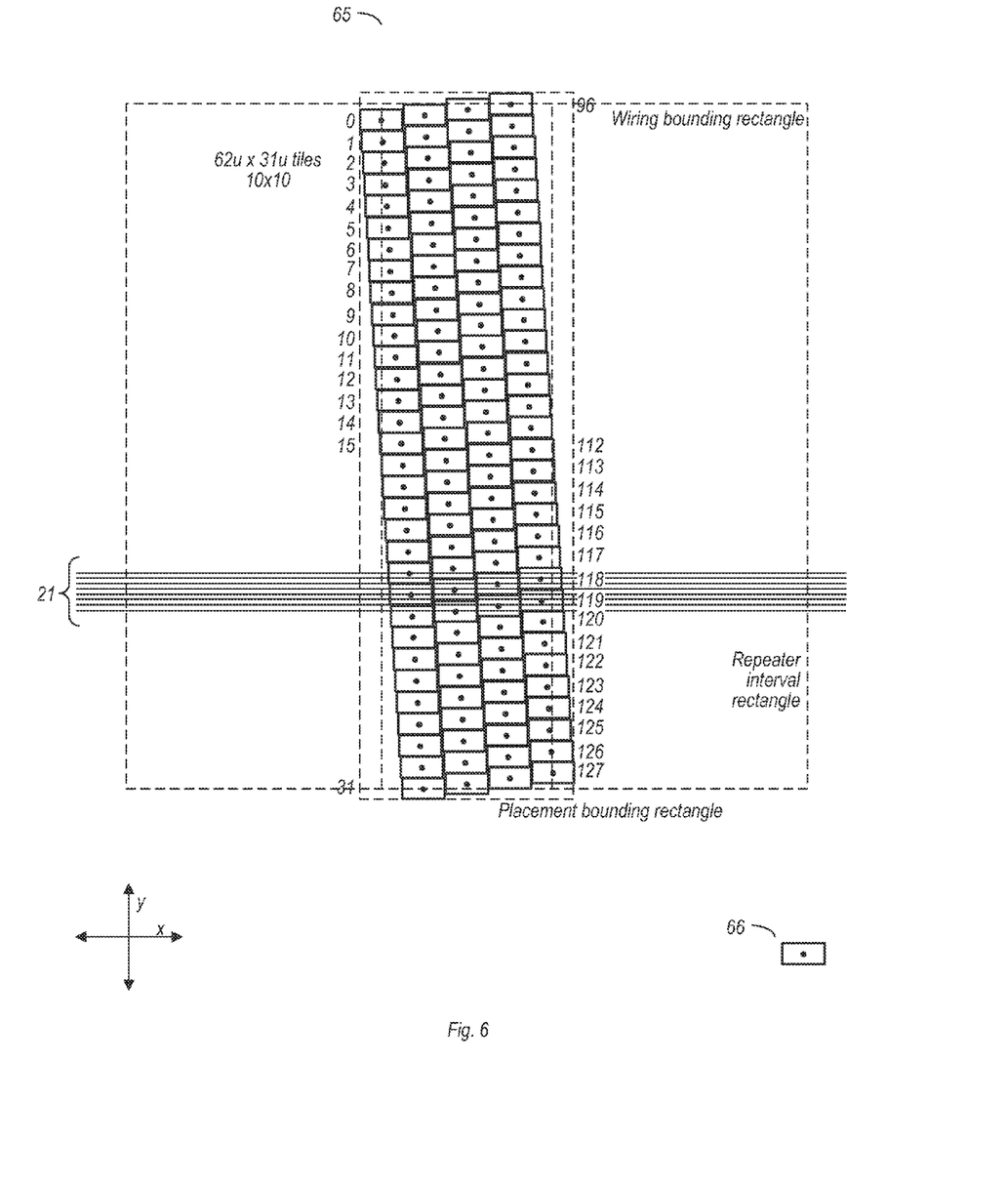
FIG. 6 is a diagram illustrating a fourth embodiment of a skewed placement grid implemented on an IC.

FIG. 6 is an embodiment of a placement grid similar to that of FIG. 5. Placement grid 65 includes a plurality of rectangular cells 66. The center point of each rectangular cell 66 is unique with respect to all others, and none of them are overlapping. In this particular embodiment, placement grid 65 is four cells wide across the page and thirty-two cells deep descending down the page. Representative horizontal signal lines 21 shown in the drawing each intersect a stacked via of a corresponding rectangular cell 66. Vertical signal lines, although not explicitly shown, may also be present. In contrast to the embodiment shown in FIG. 5, rectangular cells 66 are arranged such that the longer portion of each is aligned with the x-axis. This may provide additional space in the structure for the inclusion of vertical signal lines, if desired. As with the embodiment of FIG. 5, placement grid 65 of FIG. 6 may be suitable for implementing repeaters on a bus, and may in some cases be useful implementing a crossbar unit.

It is noted that FIGS. 3-6 illustrate only a few possible embodiments of a skewed placement grid according to this disclosure. In general, a skewed placement grid may be implemented using cells of various shapes arranged such that they are not overlapping and wherein the center point of each is located at a point that is unique along both of two perpendicular axes.

Figure 7:
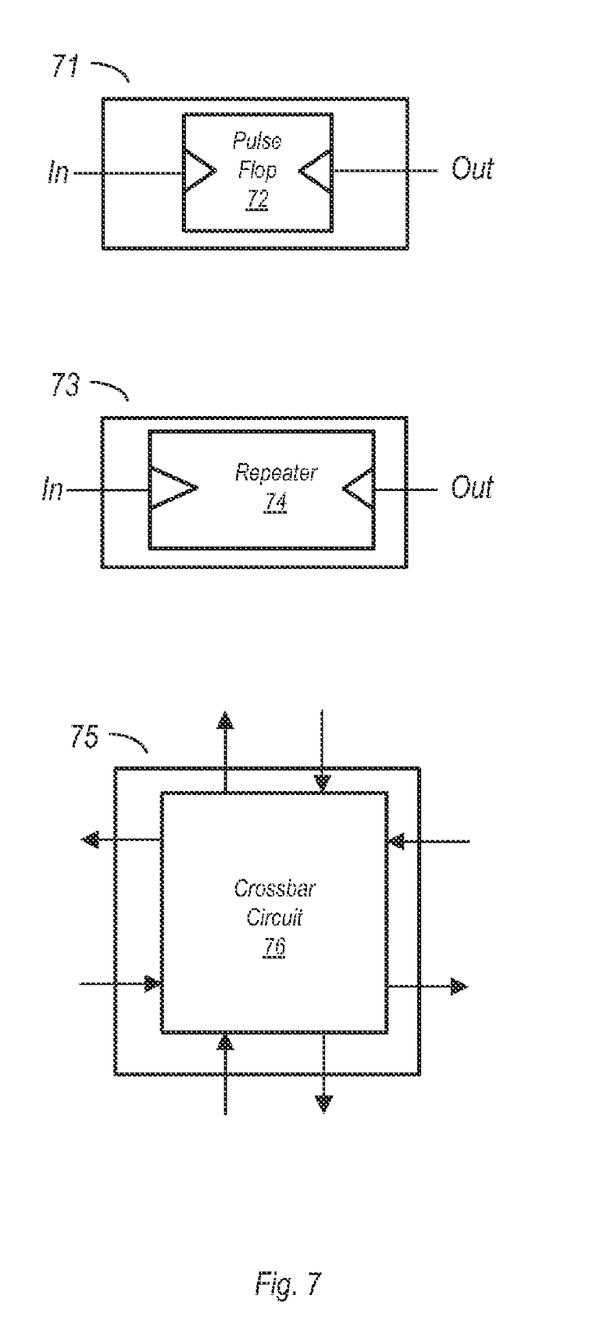
FIG. 7 is a diagram illustrating different circuits that may be implemented in the cells of a skewed placement grid.

Cell Circuitry:

FIG. 7 is a diagram illustrating different circuits that may be implemented in the cells of a skewed placement grid. It is noted here these circuits are representative of some, but not all types of circuits that may be implemented in cells of a skewed placement grid such as one of those discussed above.

Rectangular cell 71 in the embodiment shown includes a pulse flop 72. In some embodiments of an IC, pulse flops 72 may be implemented in signal paths that are frequency limiting. Although not shown here, pulse flop 72 may include a clock input coupled to receive a pulse clock. Responsive to a pulse clock edge, pulse flop 72 may become transparent and enable a signal received on the input ('In') to be conveyed to the output ('Out').

Rectangular cell 73 in the embodiment shown includes a repeater circuit 74 implemented therein. Instances of repeater circuits may be used on long signal paths, effectively breaking them into two interconnects. Repeater circuit 74 may receive a signal driven at one end and may drive the signal to a receiver at the other end of the signal path. This may aid a signal transition at the receiver while overcoming problems of resistance and capacitance that can develop on long signal interconnects. In some embodiments, repeater circuit 74 may be a static repeater circuit (e.g., two inverters coupled in series). In other embodiments, repeater circuit 74 may be a dynamic circuit (e.g., domino logic) having an output stage that is turned on responsive to a signal transition at its input and subsequently turned off after a certain delay time. In some cases, when a signal path is long enough such that a clock boundary is crossed, a state element may be included in repeater circuit 74.

Rectangular cell 75 in the embodiment shown includes a crossbar circuit 76, which may be used to connect a signal line conveying a bit of a given significance (e.g., bit 0) of one bus to a corresponding signal line of another bus. In the embodiment shown, crossbar circuit 76 includes a number of inputs and a number of outputs. It is noted however that such signal connections may also be bidirectional. Signals may be conveyed to and from crossbar circuit 76 through stacked vias (not shown in this example) of rectangular cell 75. Selection signals may also be provided to crossbar circuit 76 for selecting the signal lines to be coupled to each other. Using a number of instances of rectangular cell 75, a crossbar unit may be formed for selectively coupling buses together and thus routing traffic between agents (e.g., processor cores, memory controllers, etc.) of an IC having multiple agents.

Figure 8:
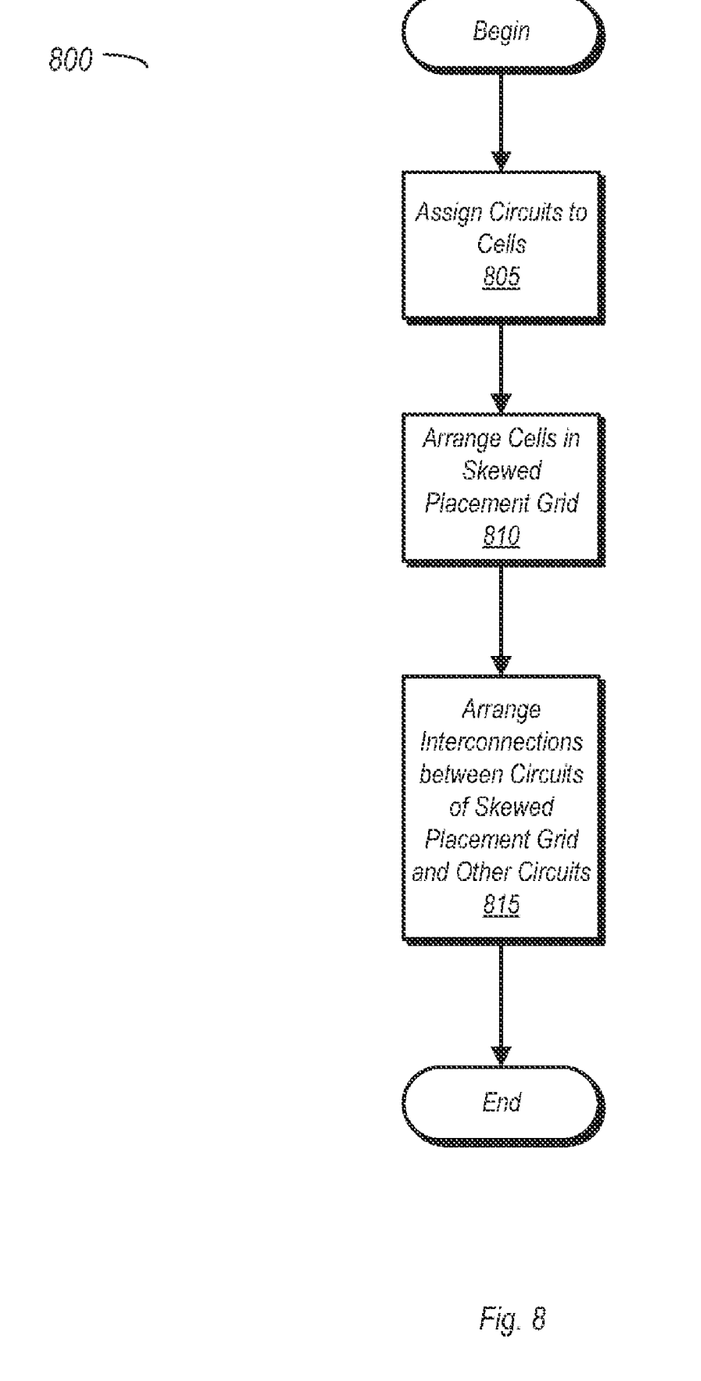
FIG. 8 is a flow diagram illustrating one embodiment of a method for performing an IC layout using circuits arranged in cells of a skewed placement grid.

IC Layout Methodology:

FIG. 8 is a flow diagram illustrating one embodiment of a method for performing an IC layout using circuits arranged in cells of a skewed placement grid. The method may be used to design and implement an IC that includes multiple instances of certain types of circuitry, including that which may be coupled to a bus having a number of signal lines.

Method 800 begins with the assigning of circuits to cells during a design phase (block 805). The cells may be one of various shapes, such as a rectangular shape as disclosed above. In some embodiments, each of the circuits assigned to a given group of cells may be identical to one another (e.g., crossbar circuits, repeater circuits). The circuits may be associated with a bus having a number of signal lines upon which signals are conveyed long distances across an IC die.

After assigning the circuits to the cells, the cells may be arranged in a skewed placement grid (block 810). The placement grid may be arranged in accordance with the principles discussed above. A center point of a given cell may be arranged to have a unique position on a first axis and a unique position on a second axis with respect to every other cell of the grid. Furthermore, each cell of the grid may be arranged such that it is not overlapping with others. Using the placement grid arrangement, circuits that are alike may be quickly arranged to form a larger circuit structure, such as a crossbar unit or a bank of repeaters. Exemplary grids formed by the described methodology include those illustrated in FIGS. 3-6.

Method 800 further includes arranging signal interconnections between circuits of the skewed placement grid formed in block 810, and other circuits (block 815). In some cases, the other circuits may also be structures that are implemented in a skewed placement grid, and thus the connections may be arranged between them (e.g., crossbar unit to crossbar unit). The signal interconnections may be arranged as straight lines.

The method described above may be repeated any number of times to complete the design of an IC. Thus, in such cases the final product may include a number of circuit structures implemented as skewed placement grids as described herein.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
   a first placement grid having a first plurality of cells, wherein a size of each of the first plurality of cells is substantially uniform, wherein each of the first plurality of cells includes a corresponding one of a first plurality of circuits, wherein a center point of each of the first plurality of cells is located at a unique coordinate along a first axis and a unique coordinate along a second axis with respect to each of the other ones of the first plurality of cells; and
   a first plurality of signal interconnections, wherein each of the plurality of signal interconnections is coupled to a single corresponding one of the first plurality of circuits and to another circuit external to the first placement grid.

2. The integrated circuit as recited in claim 1, wherein each of the plurality of cells is adjacent to at least two other cells of the first placement grid, and wherein each of the plurality of cells occupies a unique two-dimensional space with respect to each of the other ones of the plurality of cells.

3. The integrated circuit as recited in claim 1, wherein each of the plurality of cells is a rectangular cell.

4. The integrated circuit as recited in claim 1, wherein each of the plurality of signal interconnections is arranged as a straight line.

5. The integrated circuit as recited in claim 4, wherein each of the first plurality of signal interconnections is aligned along the first axis.

6. The integrated circuit as recited in claim 1, wherein each of the first plurality of signal interconnections is further coupled to a corresponding one of a second plurality of circuits, and wherein the integrated circuit further includes:
   a second placement grid having a second plurality of cells, wherein each of the second plurality of cells includes a corresponding one of the second plurality of circuits, and wherein a center point of each of the second plurality of cells has a unique coordinate along the first axis and the second axis with respect to each of the other ones of the second plurality of cells.

7. The integrated circuit as recited in claim 5, wherein the integrated circuit further includes a second plurality of signal interconnections, wherein each of the second plurality of signal interconnections is a straight line aligned along the second axis, and wherein each of the second plurality of signal interconnections is coupled to a corresponding one of the first plurality of circuits and a corresponding one of a third plurality of circuits.

8. The integrated circuit as recited in claim 7, wherein the integrated circuit further includes:
   a third placement grid having a third plurality of cells, wherein each of the third plurality of cells includes a corresponding one of the third plurality of circuits, and wherein a center point of each of the third plurality of cells has a unique coordinate along the first axis and the second axis with respect to each of the other ones of the third plurality of cells.

9. An integrated circuit comprising:
   a plurality of buses including at lease one bus aligned along a first axis, and at least one bus aligned along a second axis, wherein each of the plurality of buses includes a corresponding plurality of signal interconnections coupled between two circuits of the integrated circuit;
   a plurality of rectangular cells of substantially uniform size arranged at an intersection of two or more of the plurality of buses, wherein each of the rectangular cells includes a corresponding one of a plurality of circuits coupled between two or more of the plurality of buses, wherein each of the plurality of rectangular cells is adjacent to two or more other ones of the plurality of rectangular cells, and wherein each of the plurality of rectangular cells is offset along both the first axis and the second axis with respect to each adjacent one of the plurality of rectangular cells, and wherein each of the plurality of rectangular cells occupies a unique two-dimensional space with respect to each of the other ones of the plurality of rectangular cells.

10. The integrated circuit as recited in claim 9, wherein each signal interconnection of each of the plurality of buses is a straight line.

11. The integrated circuit as recited in claim 9, wherein the first axis is perpendicular with respect to the second axis.

12. The integrated circuit as recited in claim 9, wherein each of the plurality of rectangular cells corresponds to a unique bit position for one or more of the plurality of buses.

13. The integrated circuit as recited in claim 12, wherein bit positions corresponding to adjacent ones of the plurality of rectangular cells arranged along the first axis are sequentially numbered.

14. The integrated circuit as recited in claim 12, wherein adjacent ones of the plurality of rectangular cells arranged along the second axis correspond to bit positions that differ in number from each other by multi-bit increments.

15. The integrated circuit as recited in claim 9, wherein each of the plurality of circuits is a crossbar circuit configured to couple a signal interconnection of a first selected one of the plurality of buses to a signal interconnection of equal bit significance of a second one of the plurality of buses.

16. The integrated circuit as recited in claim 15, wherein each of the crossbar circuits is configured to couple an interconnection of a first bus aligned along the first axis to a corresponding interconnection of a second bus aligned along the second axis.

17. The integrated circuit as recited in claim 9, wherein each of the plurality of circuits is a repeater circuit.

18. The integrated circuit as recited in claim 9, wherein each of the plurality of circuits is a pulse flop circuit.

19. A method comprising:
   assigning, by a computer system, each of a plurality of circuits to corresponding ones of a plurality of cells;
   arranging, using the computer system, the plurality of cells in a placement grid such that a center point of each of the plurality of cells is located at a unique coordinate along a first axis and at a unique coordinate along a second axis with respect to each of the other ones of the plurality of cells and such that each of the plurality of cells occupies a unique two-dimensional space with respect to each of the other ones of the plurality of cells, wherein each of the plurality of cells is of a substantially uniform size;
   arranging, using the computer system, each of a plurality of signal lines to be coupled to a single corresponding one of the plurality of circuits in the placement grid, wherein each of the plurality of signal lines is further coupled to another circuit external to the placement grid.

20. The method as recited in claim 19, wherein each of the plurality of cells has a rectangular shape, and wherein each of the plurality of signal lines is a straight line with no bends.

* * * * *

UNITED STATES PATENT AND TRADEMARK OFFICE
CERTIFICATE OF CORRECTION

| | | |
|---|---|---|
| PATENT NO. | : 8,341,585 B2 | |
| APPLICATION NO. | : 13/022913 | |
| DATED | : December 25, 2012 | |
| INVENTOR(S) | : Masleid | |

It is certified that error appears in the above-identified patent and that said Letters Patent is hereby corrected as shown below:

On Title Page, in column 2, under "Attorney, Agent, or Firm", line 1, delete "Meyerton" and insert -- Meyertons --, therefor.

In the Specification:
In column 1, line 52, delete "lease" and insert -- least --, therefor.

In the Claims:
In column 9, line 19, in Claim 9, delete "lease" and insert -- least --, therefor.

Signed and Sealed this
Sixteenth Day of April, 2013

Teresa Stanek Rea
*Acting Director of the United States Patent and Trademark Office*